US012783079B2

(12) United States Patent
He et al.

(10) Patent No.: US 12,783,079 B2
(45) **Date of Patent: *Nov. 3, 2026**

(54) TOUCH STRUCTURE HAVING THROUGH HOLES ON OVERLAPPING PARTS AND DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xinglong He, Beijing (CN); Zhangmin Wu, Beijing (CN); Zewen Bo, Beijing (CN); Shuo Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/074,215

(22) Filed: Mar. 7, 2025

(65) Prior Publication Data

US 2025/0208727 A1 Jun. 26, 2025

Related U.S. Application Data

(63) Continuation of application No. 17/789,674, filed as application No. PCT/CN2021/094676 on May 19, 2021, now Pat. No. 12,566,514.

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0445* (2019.05); *G06F 3/047* (2013.01);
(Continued)

(58) Field of Classification Search
CPC ......... G06F 2203/04112; G06F 3/0412; G06F 3/04164; G06F 3/0443; G06F 3/0445;
(Continued)

(56) References Cited

U.S. PATENT DOCUMENTS 8,502,445 B2 8/2013 Levermore et al.
9,298,331 B2 3/2016 Nakamura
(Continued)

FOREIGN PATENT DOCUMENTS

CN 206209239 U 5/2017
CN 111584599 A 8/2020
(Continued)

OTHER PUBLICATIONS

Notice of Reasons for Refusal dated Jul. 29, 2025 received in Japanese Patent Application No. 2022-558522.
(Continued)

*Primary Examiner* — Richard J Hong
(74) *Attorney, Agent, or Firm* — Scully, Scott, Murphy & Presser, P.C.

(57) ABSTRACT

A touch structure and a display panel are provided. The touch structure includes a substrate and touch units, wherein at least one of the touch units includes a first conductive layer, a spacing insulating layer and a second conductive layer; the first conductive layer includes a first pattern formed by a plurality of first wirings, and the second conductive layer includes a second pattern formed by a plurality of second wirings spaced apart from each other, and the first wiring substantially extends along a first direction wholly, and the second wiring substantially extends along a
(Continued)

second direction wholly, an angle between the first direction and the second direction is greater than or equal to 30 degrees and less than 90 degrees.

20 Claims, 6 Drawing Sheets

(51) Int. Cl.
*G06F 3/047* (2006.01)
*H10K 59/122* (2023.01)
*H10K 59/35* (2023.01)
*H10K 59/80* (2023.01)
*H10K 59/131* (2023.01)
*H10K 59/65* (2023.01)

(52) U.S. Cl.
CPC ......... *H10K 59/122* (2023.02); *H10K 59/352* (2023.02); *H10K 59/353* (2023.02); *H10K 59/873* (2023.02); *H10K 59/8792* (2023.02); *H10K 59/131* (2023.02); *H10K 59/65* (2023.02)

(58) Field of Classification Search
CPC .. G06F 3/0446; G06F 3/047; G06F 3/041662; G06F 3/0448; H10K 59/121; H10K 59/122; H10K 59/131; H10K 59/352; H10K 59/353; H10K 59/40; H10K 59/65; H10K 59/873; H10K 59/8792; H10K 77/111; G09G 3/3275
See application file for complete search history.

(56) References Cited

U.S. PATENT DOCUMENTS

| | | | | |
|---|---|---|---|---|
| 11,302,899 | B2 | 4/2022 | Ouyang et al. | |
| 2001/0011868 | A1 | 8/2001 | Fukunaga et al. | |
| 2011/0102308 | A1 | 5/2011 | Nakamura et al. | |
| 2015/0015466 | A1 | 1/2015 | Feng | |
| 2015/0160754 | A1* | 6/2015 | Wenzel | G06F 3/041662 345/174 |
| 2016/0195983 | A1* | 7/2016 | Miyake | G06F 3/0448 345/174 |
| 2018/0095567 | A1 | 4/2018 | Lee et al. | |
| 2019/0064960 | A1* | 2/2019 | Na | H10K 77/111 |
| 2019/0140030 | A1 | 5/2019 | Huangfu et al. | |
| 2019/0213379 | A1 | 7/2019 | Zhao et al. | |
| 2019/0258338 | A1* | 8/2019 | Park | G06F 3/0412 |
| 2019/0341428 | A1 | 11/2019 | Lee et al. | |
| 2020/0004381 | A1 | 1/2020 | Han et al. | |
| 2020/0013833 | A1 | 1/2020 | Wang et al. | |
| 2020/0117304 | A1* | 4/2020 | Lee | G06F 3/0443 |
| 2020/0133414 | A1 | 4/2020 | Lee et al. | |
| 2020/0343477 | A1* | 10/2020 | Zeng | G09G 3/3275 |
| 2021/0149525 | A1* | 5/2021 | Xu | G06F 3/0448 |
| 2021/0326001 | A1* | 10/2021 | Jo | H10K 59/40 |
| 2022/0206610 | A1* | 6/2022 | Kim | G06F 3/0446 |
| 2023/0086115 | A1 | 3/2023 | Takagi | |
| 2023/0214040 | A1* | 7/2023 | Kim | G06F 3/0443 345/174 |

FOREIGN PATENT DOCUMENTS

| | | | |
|---|---|---|---|
| CN | 112420955 | A | 2/2021 |
| CN | 112420956 | A | 2/2021 |
| CN | 112786812 | A | 5/2021 |
| IN | 201947034041 | A | 12/2019 |
| JP | 2011118330 | A | 6/2011 |
| JP | 2011151652 | A | 8/2011 |
| JP | 2019129221 | A | 8/2019 |
| JP | 2020194158 | A | 12/2020 |
| JP | 2024518006 | A | 4/2024 |
| KR | 10-2016-0005596 | A | 1/2016 |
| WO | 2013191082 | A1 | 12/2013 |
| WO | 2019155318 | A1 | 8/2019 |
| WO | 2019218659 | A1 | 11/2019 |

OTHER PUBLICATIONS

Notice of Reasons for Refusal dated Jul. 29, 2025 received in Japanese Patent Application No. 2022-558517.
Request for the Submission of an Opinion dated Jun. 20, 2025 received in Korean Patent Application No. 10-2023-7000767.
Third Office Action dated Jun. 30, 2025 received in Chinese Patent Application No. 202110726472.5.
Indian Hearing Notice dated Apr. 7, 2026 received in Indian Application No. 202317029796.
Indian Hearing Notice dated Apr. 2, 2026 received in Indian Application No. 202217048001.
Indian Hearing Notice dated Mar. 5, 2026 received in Indian Application No. 202217048288.
Office Action dated Jul. 10, 2026, received in U.S. Appl. No. 18/735,021.
Notice of Reasons for Refusal dated Jul. 28, 2026 received in Japanese Patent Application No. 2025-135060.

* cited by examiner

TOUCH STRUCTURE HAVING THROUGH HOLES ON OVERLAPPING PARTS AND DISPLAY PANEL

CROSS REFERENCE TO RELATED APPLICATIONS

This application is a continuation application of U.S. patent application Ser. No. 17/789,674, which is a national phase of International Application No. PCT/CN2021/094676, filed on May 19, 2021. All the aforementioned patent applications are hereby incorporated by reference in their entireties.

TECHNICAL FIELD

Embodiments of the present disclosure relate to a touch structure and a display panel.

BACKGROUND

User interfaces with touch functions are widely used in various electronic devices, such as display devices such as mobile phones and tablet computers. The touch structure used to realize the touch function includes a touch electrode structure, and the arrangement of the touch electrode structure affects the sensitivity and accuracy of the touch function, and thus is an important factor affecting the user experience.

SUMMARY

At least one embodiment of the present disclosure provides a touch structure, the touch structure comprises a substrate and a plurality of touch units on the substrate, at least one of the plurality of touch units comprises a first conductive layer, a spacing insulating layer and a second conductive layer sequentially stacked on the substrate; the first conductive layer comprises a first pattern formed by a plurality of first wirings spaced apart from each other, and the second conductive layer comprises a second pattern formed by a plurality of second wirings spaced apart from each other, at least one of the plurality of first wirings comprises a first overlapping part overlapped with at least one of the plurality of second wirings, the at least one of the plurality of second wirings comprises a second overlapping part overlapped with the first overlapping part, and a first segment in which the first overlapping part is located has a different extending direction from a second segment in which the second overlapping part is located, the first segment is a segment of the first wiring with the first overlapping part as an extending end, and the second segment is a segment of the second wiring with the second overlapping part as an extending end.

For example, in the touch structure provided by at least one embodiment of the present disclosure, the first segment comprises a straight line segment and the second segment comprises a straight line segment, and extending directions of the first segment and the second segment are respectively extending directions of the straight line segments, and/or the first segment comprises an arc segment and the second segment comprises an arc segment, and extending directions of the first segment and the second segment are respectively extending directions of tangents of the arc segments by taking the first overlapping part and the second overlapping part as ends.

For example, in the touch structure provided by at least one embodiment of the present disclosure, a size of one first overlapping part in any direction is greater than or equal to a line width of the first wiring in a direction perpendicular to an extending direction of the first wiring, and less than or equal to twice the line width of the first wiring in the direction perpendicular to the extending direction of the first wiring; a size of one second overlapping part in any direction is greater than or equal to a line width of the second wiring in a direction perpendicular to an extending direction of the second wiring, and less than or equal to twice the line width of the second wiring in the direction perpendicular to the extending direction of the second wiring.

For example, in the touch structure provided by at least one embodiment of the present disclosure, the first wiring substantially extends along a first direction wholly, and the second wiring substantially extends along a second direction wholly.

For example, in the touch structure provided by at least one embodiment of the present disclosure, an angle between the first direction and the second direction ranges from 30° to 90°.

For example, in the touch structure provided by at least one embodiment of the present disclosure, at at least one position at which the first overlapping part is overlapped with the second overlapping part, the first overlapping part and the second overlapping part are electrically connected by a through hole in the spacing insulating layer.

For example, in the touch structure provided by at least one embodiment of the present disclosure, in one touch unit, the plurality of first wirings comprise at least one first connection wiring, and a first overlapping part of the first connection wiring is electrically connected with a second overlapping part of at least part of the plurality of second wirings overlapped with the first overlapping part by a through hole in the spacing insulating layer.

For example, in the touch structure provided by at least one embodiment of the present disclosure, second overlapping parts of any two adjacent second wirings are electrically connected through the at least one first connection wiring.

For example, in the touch structure provided by at least one embodiment of the present disclosure, the at least one first connection wiring comprises a plurality of first connection wirings, and the plurality of first connection wirings are spaced apart from each other; the plurality of first connection wirings further comprise a plurality of second connection wirings, and the plurality of second connection wirings are spaced apart from the first connection wirings; the plurality of second connection wirings are insulated from the plurality of first connection wirings and the plurality of second wirings.

For example, the touch structure provided by at least one embodiment of the present disclosure further comprises a touch driving circuit, and the first connection wiring is electrically connected with the touch driving circuit.

For example, in the touch structure provided by at least one embodiment of the present disclosure, the first conductive layer further has a third segment connected to the plurality of first connection wirings and extending in a different direction from the plurality of first connection wirings.

For example, in the touch structure provided by at least one embodiment of the present disclosure, a first end of the third segment is connected to the plurality of first connection wirings, and a second end of the third segment is spaced apart from adjacent second connection wirings, and a minimum distance of an interval between the second end and the adjacent second connection wirings ranges from 1 μm to 6 μm.

For example, in the touch structure provided by at least one embodiment of the present disclosure, the first conductive layer further has a fourth segment spaced apart from the plurality of first wirings and extending in a different direction of the plurality of first wirings.

For example, in the touch structure provided by at least one embodiment of the present disclosure, both ends of the fourth segment are spaced apart from the plurality of first wirings, and a minimum distance of an interval between each of the both ends and the plurality of first wirings ranges from 1 μm to 6 μm.

For example, in the touch structure provided by at least one embodiment of the present disclosure, line widths of the plurality of first wirings range from 2 μm to 4 μm.

For example, in the touch structure provided by at least one embodiment of the present disclosure, line widths of the plurality of second wirings range from 2 μm to 4 μm.

For example, in the touch structure provided by at least one embodiment of the present disclosure, the plurality of touch units are arranged in an array.

At least one embodiment of the present disclosure further provides a display panel, the display panel comprises a display substrate and the touch structure mentioned above, the display substrate comprises a base substrate and a driving circuit layer, a light-emitting member layer and an encapsulation layer sequentially arranged on the base substrate, the touch structure is disposed on a side of the encapsulation layer away from the base substrate, and the first conductive layer is closer to the encapsulation layer than the second conductive layer.

For example, the display panel provided by at least one embodiment of the present disclosure further comprises a black matrix layer, the black matrix layer is disposed on a side of the touch structure away from the base substrate or on a side of the touch structure close to the base substrate and comprises a plurality of first light-transmitting openings and a plurality of second light-transmitting openings, the light-emitting member layer comprises a plurality of light-emitting members, and the plurality of first light-transmitting openings are configured to respectively transmit light emitted by the plurality of light-emitting members, the driving circuit layer comprises a plurality of light-transmitting parts, each of at least part of the second light-transmitting openings is disposed correspondingly to at least one of the plurality of light-transmitting parts, and in a second light-transmitting opening and a light-transmitting part disposed correspondingly, an orthographic projection of the second light-transmitting opening on the base substrate at least partially overlaps with an orthographic projection of the light-transmitting part on the base substrate.

For example, in the display panel provided by at least one embodiment of the present disclosure, in a direction parallel to the base substrate, distances between the plurality of second light-transmitting openings and the plurality of first wirings and/or the plurality of second wirings are greater than 1 μm.

For example, in the display panel provided by at least one embodiment of the present disclosure, in the direction parallel to the base substrate, distances between the plurality of first light-transmitting openings and the plurality of first wirings and/or the plurality of second wirings are greater than 1 μm.

For example, in the display panel provided by at least one embodiment of the present disclosure, in a direction perpendicular to the base substrate, the plurality of first wirings and the plurality of second wirings do not overlap with the plurality of first light-transmitting openings and the plurality of second light-transmitting openings.

For example, in the display panel provided by at least one embodiment of the present disclosure, one first wiring or one second wiring is disposed between two adjacent second light-transmitting openings of the plurality of second light-transmitting openings.

For example, in the display panel provided by at least one embodiment of the present disclosure, the display substrate has a plurality of pixel units arranged in an array, each of the plurality of pixel units comprises a plurality of sub-pixels, and each of the plurality of sub-pixels comprises a pixel driving circuit in the driving circuit layer and a light-emitting member in the light-emitting member layer, the light-emitting member has a light-emitting region; at least portion of the plurality of light-transmitting parts are disposed between light-emitting regions of light-emitting members of adjacent sub-pixels.

For example, in the display panel provided by at least one embodiment of the present disclosure, in the direction perpendicular to the base substrate, the plurality of first wirings and the plurality of second wirings do not overlap with light-emitting regions of light-emitting members of the plurality of sub-pixels.

For example, in the display panel provided by at least one embodiment of the present disclosure, in a direction parallel to the base substrate, at least one second light-transmitting opening of the plurality of second light-transmitting openings is provided between a light-emitting region of a light-emitting member of one sub-pixel and a first wiring or a second wiring, a distance from the light-emitting region of the light-emitting member of the one sub-pixel to the first wiring or the second wiring adjacent to the at least one second light-transmitting opening is greater than a distance between the light-emitting region of the light-emitting member of the one sub-pixel and other first wirings or second wirings.

For example, in the display panel provided by at least one embodiment of the present disclosure, the plurality of pixel units comprise at least one first pixel unit, in a direction perpendicular to the display substrate, a plurality of sub-pixels included in the first pixel unit and the plurality of second light-transmitting openings are in one-to-one correspondence and overlap with each other.

For example, the display panel provided by at least one embodiment of the present disclosure further comprises a plurality of color filters respectively disposed in the plurality of first light-transmitting openings.

For example, the display panel provided by at least one embodiment of the present disclosure further comprises a texture touch surface and an image sensor array, the image sensor array is on a side of the driving circuit layer away from the light-emitting member layer, and comprises a plurality of image sensors, and the plurality of image sensors are configured to receive light emitted from the plurality of light-emitting member in the light-emitting member layer and reflected by a texture on the texture touch surface and reaching the plurality of image sensors through the second light-transmitting opening and the light-transmitting part for a texture collection.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
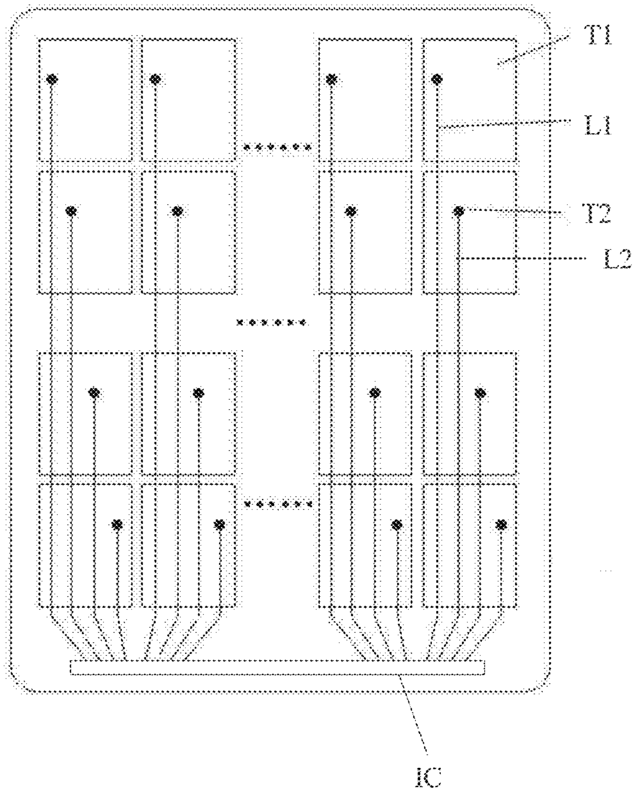
FIG. 1 is a planar diagram of a self-capacitance touch structure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Organic light-emitting diode (OLED) display panels have characteristics of self-illumination, high contrast, low energy consumption, wide viewing angle, fast response speed, being capable of using for flexible panels, wide temperature range, simple manufacturing and so on, have wide development prospection. In order to meet diverse needs of users, it is of great significance to integrate a variety of functions, such as touch function, fingerprint identification function and so on, in the display panel. For example, forming an on-cell touch structure in an OLED display panel is an implementation manner, which realizes the touch function of the display panel by forming the touch structure on the encapsulation film of the OLED display panel.

Based on differences of the working principle and transmission medium, the touch structure may be divided into the resistance type, the capacitance type, the surface acoustic wave type and the infrared type, among them, the capacitance type touch structure has high accuracy and strong anti-interference ability, and therefore is widely used. The capacitance type touch structure is mainly divided into a mutual capacitance touch structure and a self-capacitance touch structure. In the mutual capacitance touch structure, a mutual capacitor is formed by a first touch electrode layer and a second touch electrode layer overlapped with each other, and the mutual capacitance touch structure is configured to detect the touch position through the change of the mutual capacitance. In the self-capacitance touch structure, a self-capacitor is formed by a touch electrode and a human body or the earth, and the self-capacitance touch structure is configured to detect the touch position through the change of the self-capacitance. The self-capacitance touch structure has characteristics of low power consumption and simple structure, and is widely used in various display panels.

Figure 2:
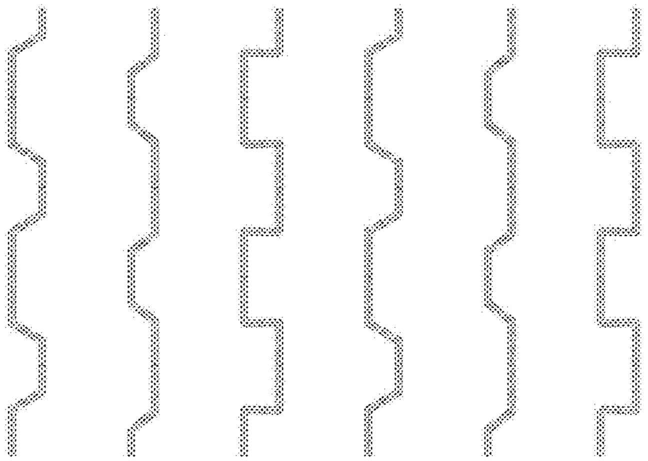
FIG. 2 is a planar diagram of a first touch layer of a self-capacitance touch structure.

For example, FIG. 1 shows a schematic planar diagram of a self-capacitance touch structure. As shown in FIG. 1, the self-capacitance touch structure has a plurality of touch units T1, T2 and the like arranged at intervals, and the plurality of touch units T1 and T2 are respectively connected to a touch chip IC through a plurality of touch wirings L1 and L2. For each touch unit, it has a first touch layer and a second touch layer that are stacked and has a touch insulating layer between the first touch layer and the second touch layer. For example, FIG. 2 shows a planar diagram of the first touch layer, FIG. 3 shows a planar diagram of the second touch layer, and FIG. 4 shows a planar diagram of the stacking of the first touch layer and the second touch layer.

Figure 3:
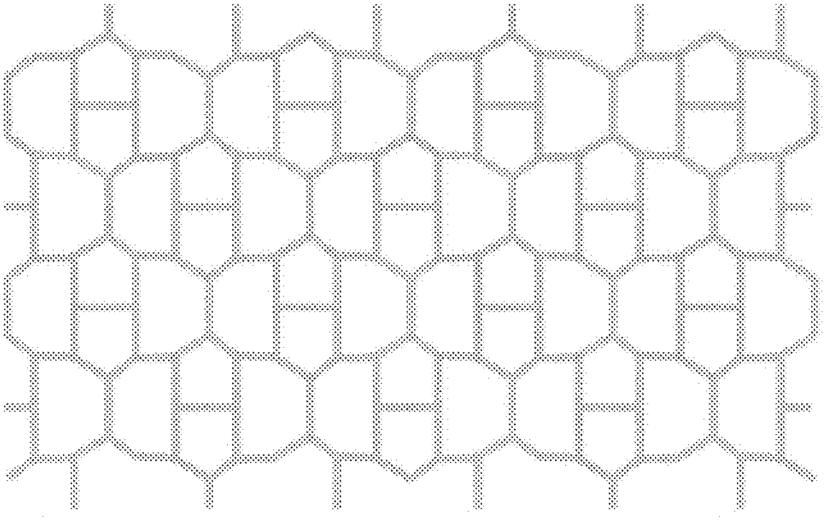
FIG. 3 is a planar diagram of a second touch layer of a self-capacitance touch structure.

As shown in FIG. 3, the second touch layer has a metal grid structure, which may be used as a touch sensing structure. When a finger touches the touch structure, a capacitor will be formed by the finger and a metal line at a certain position in the metal grid structure, so as to change the capacitance formed between the original metal grid structure and the earth. Therefore, the touch chip IC can detect a position where the capacitance changes, then judge the position of finger touch. For example, as shown in FIG. 2, the first touch layer may be used as a wiring layer, which includes a plurality of touch wirings, and the touch wirings can respectively connect the plurality of touch units to the touch IC.

Figure 4:
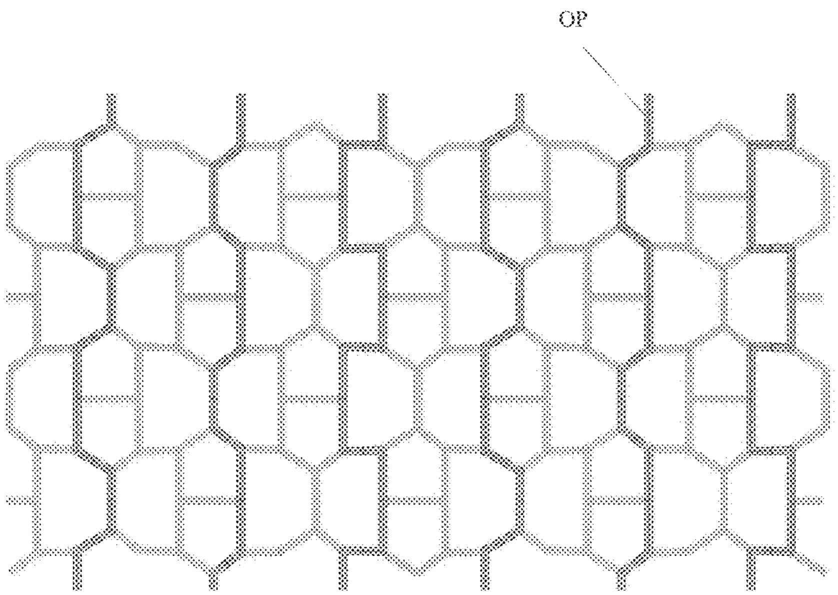
FIG. 4 is a planar diagram of the stacking of a first touch layer and a second touch layer of a self-capacitive touch structure.

As shown in FIG. 4, after the first touch layer and the second touch layer are stacked, the wirings in the first touch layer and the second touch layer are completely overlapped with each other, so the overlapping position OP will produce large parasitic capacitance, resulting in poor touch effect. Moreover, as shown in FIG. 2, the touch wirings in the first touch layer are arranged vertically as a whole, under strong light, the user can easily see the wirings in the first touch layer from the surface of the touch structure, the pattern visualization degree of the first touch layer is high and the user experience is poor.

At least one embodiment of the present disclosure provides a touch structure, the touch structure includes a substrate and a plurality of touch units on the substrate, at least one of the plurality of touch units includes a first conductive layer, a spacing insulating layer and a second conductive layer sequentially stacked on the substrate; the first conductive layer includes a first pattern formed by a plurality of first wirings spaced apart from each other, and the second conductive layer comprises a second pattern formed by a plurality of second wirings spaced apart from each other, at least one of the plurality of first wirings includes a first overlapping part overlapped with at least one of the plurality of second wirings, the at least one of the plurality of second wirings includes a second overlapping part overlapped with the first overlapping part, and a first segment where the first overlapping part is located has a different extending direction from a second segment where the second overlapping part is located, the first segment is a segment of the first wiring which is extended taking the first overlapping part as an end, and the second segment is a segment of the second wiring which is extended taking the second overlapping part as an end.

In the above touch structure provided by the embodiments of the present disclosure, the first segment of the plurality of first wirings and the second segment of the plurality of second wirings have different line extending directions, and therefore when the first segment and the second segment are overlapped, the first overlapping part of the plurality of first wirings and the second overlapping part of the plurality of second wirings are overlapped in a "point shape", which has a small overlapping area. Therefore, the plurality of first wirings and the plurality of second wirings will not generate parasitic capacitance, or the generated parasitic capacitance is very small and negligible, which can improve the touch accuracy and touch sensitivity of the touch structure, and then improve the touch effect and user experience.

The touch structure and display panel provided by some embodiments of the present disclosure are described below through several specific embodiments.

Figure 5:
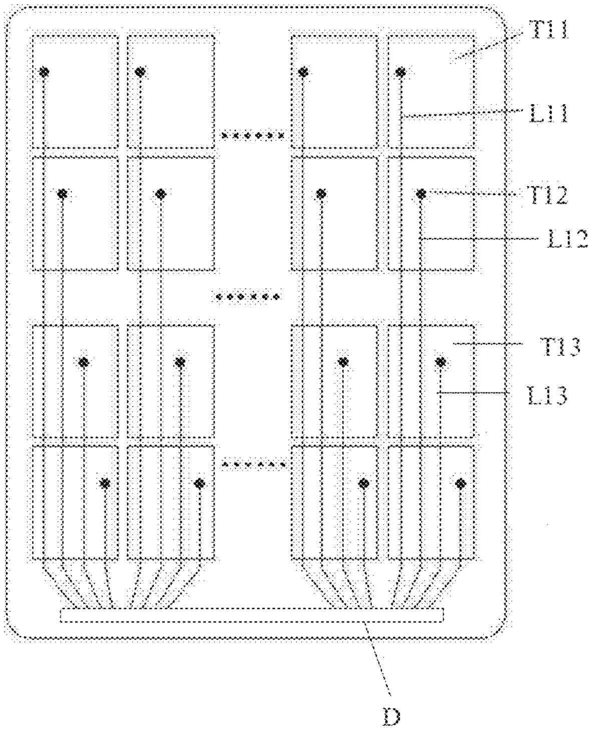
FIG. 5 is a planar diagram of a touch structure provided by at least one embodiment of the present disclosure.
Figure 6:
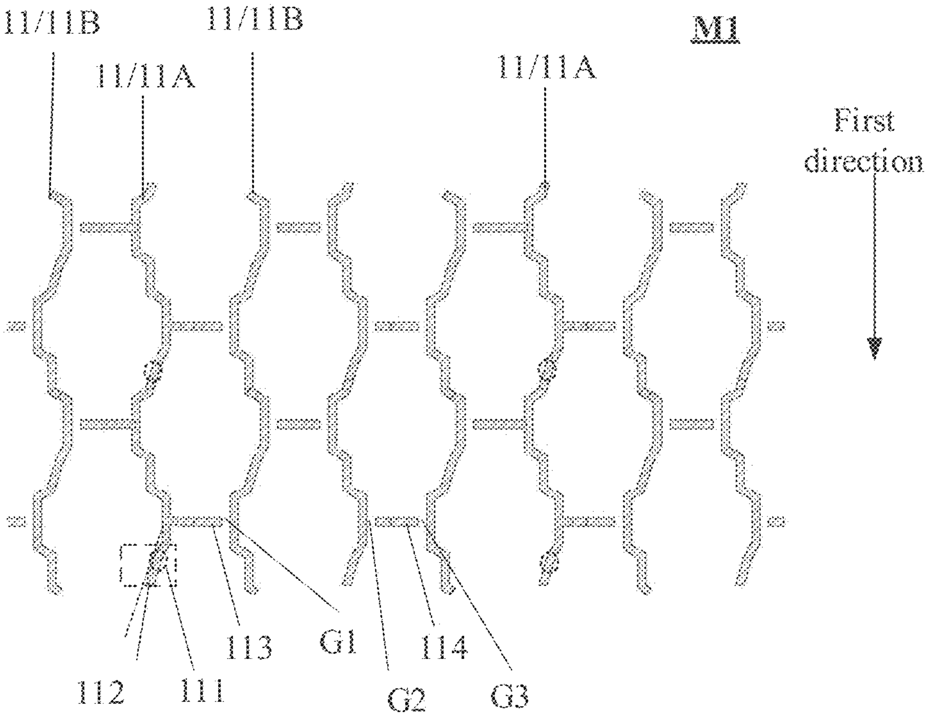
FIG. 6 is a planar diagram of a first conductive layer of a touch structure provided by at least one embodiment of the present disclosure.
Figure 7:
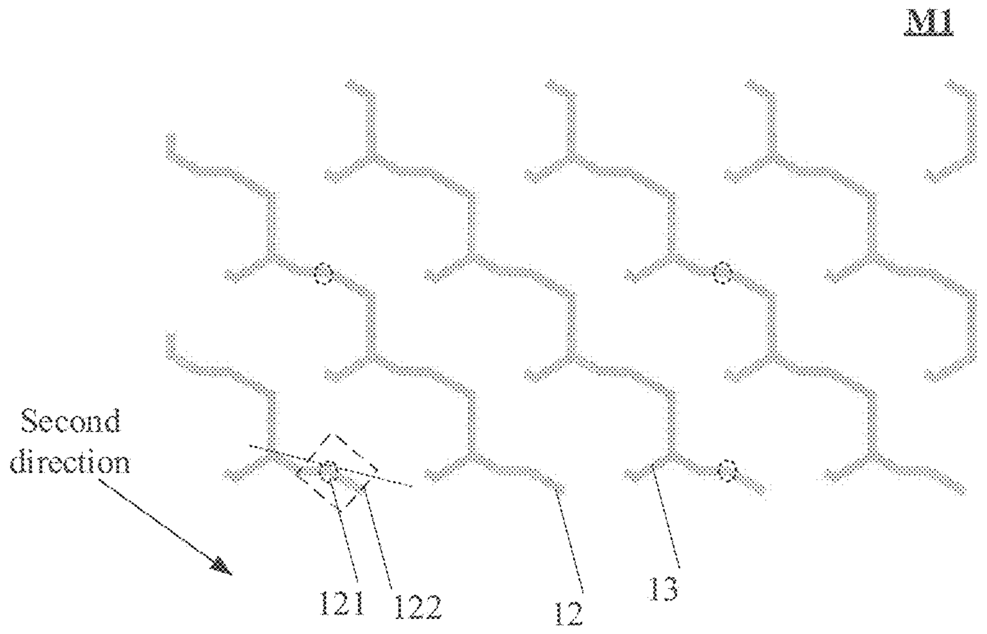
FIG. 7 is a planar diagram of a second conductive layer of a touch structure provided by at least one embodiment of the present disclosure.
Figure 8:
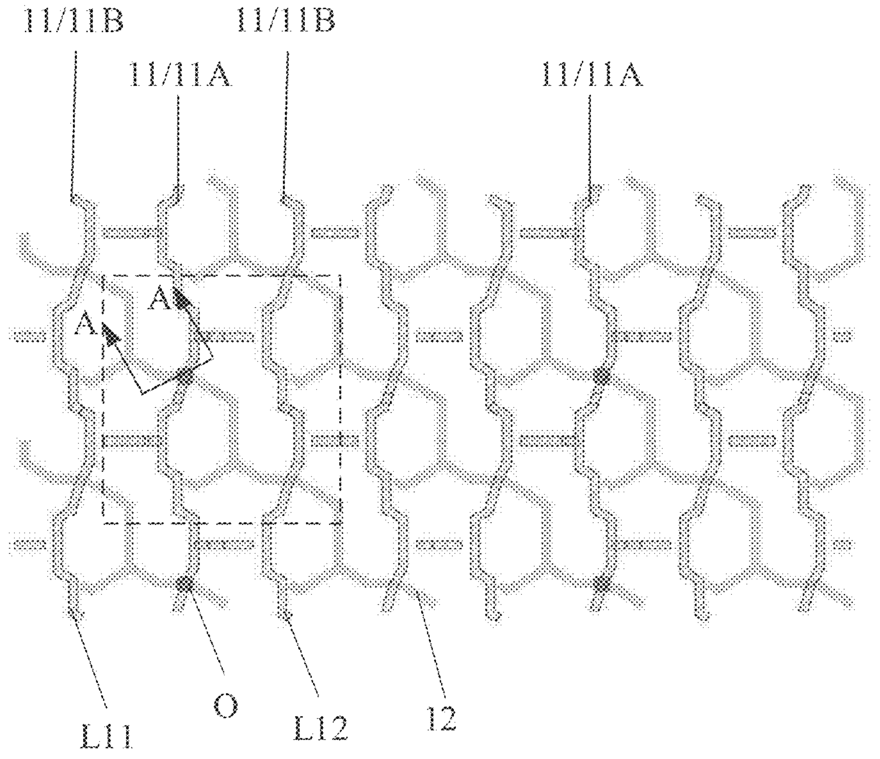
FIG. 8 is a planar diagram of a stacking of a first conductive layer and a second conductive layer of a touch structure provided by at least one embodiment of the present disclosure.
Figure 9:
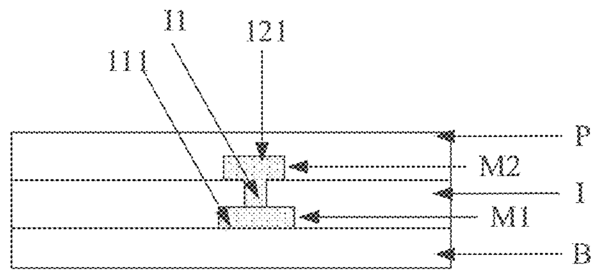
FIG. 9 is a schematic cross-sectional diagram of the touch structure in FIG. 8 along a line A-A.

At least one embodiment of the present disclosure provides a touch structure, FIG. 5 is a planar diagram of the touch structure, FIG. 6 is a planar diagram of a first conductive layer of a touch unit in the touch structure, FIG. 7 is a planar diagram of a second conductive layer of the touch unit, FIG. 8 is a planar diagram of stacking of a first conductive layer and a second conductive layer of the touch unit, and FIG. 9 is a schematic cross-sectional diagram of the touch unit in FIG. 8 along a line A-A.

As shown in FIG. 5 to FIG. 9, the touch structure includes a substrate B and a plurality of touch units T11, T12 and T13, etc., on the substrate B, and the plurality of touch units T11, T12 and T13, etc. are arranged in an array. For example, the whole of each touch unit may be in a block shape, for example, a planar shape of each touch unit is a rectangle shape or a square shape. The touch units T11, T12 and T13 are arranged at intervals and are electrically connected to the touch driving circuit D through a plurality of touch wirings L11, L12 and L13 respectively, so as to transmit electrical signals to the touch driving circuit D or receive electrical signals from the touch driving circuit D.

For example, at least one (for example, each) of the plurality of touch units includes a first conductive layer M1, a spacing insulating layer I and a second conductive layer M2 sequentially stacked on the substrate B. The first conductive layer M1 includes a first pattern formed by a plurality of first wirings 11 spaced apart from each other, and the second conductive layer M2 includes a second pattern formed by a plurality of second wirings 12 spaced apart from each other. For example, as shown in FIGS. 6-8, at least one (for example, each) of the plurality of first wirings 11 includes a first overlapping part 111 overlapped with at least one of the plurality of second wirings 12, and at least one (for example, each) of the second wirings 12 includes a second overlapping part 112 overlapped with the first overlapping part 111, and a first segment 112 where the first overlapping part 111 is located (a part circled by a dotted frame in FIG. 6) and a second segment 122 where the second overlapping part 121 is located (the part circled by the dotted frame in FIG. 7) have different extending directions, the first segment 112 is a portion of the first wiring 11 including the first overlapping part 111, that is, the first segment 112 is a segment of the first wiring 11 which is extended taking the first overlapping part 111 as an end. The second segment 122 is a portion of the second wiring 12 including the second overlapping part 121, that is, the second segment 112 is a segment of the second wiring 12 which is extended taking the second overlapping part 121 as an end.

Therefore, because the first segment 112 of the plurality of first wirings 11 and the second segment 122 of the plurality of second wirings 12 have different line extending directions, when the first segment 112 and the second segment 122 are overlapped, the first overlapping part 111 of the plurality of first wirings 11 and the second overlapping part 121 of the plurality of second wirings 12 are overlapped in a "point shape", which has a small overlapping area. Therefore, the plurality of first wirings 11 and the plurality of second wirings 12 do not generate parasitic capacitance or the generated parasitic capacitance is negligible, which can improve the touch accuracy and touch sensitivity of the touch structure, and then improve the touch effect and user experience.

For example, the first segment 112 and the second segment 122 respectively include straight line segments, and in this case, extending directions of the first segment 112 and the second segment 122 are respectively extending directions of the straight line segments, or the first segment 112 and the second segment 122 include arc segments, and in this case, the extending directions of the first segment 112 and the second segment 122 are respectively extending directions of tangents of the arc segments taking the first overlapping part 111 and the second overlapping part 121 as an end. For example, in FIG. 6, the extending direction of the first segment 112 is the extending direction of the dotted line in FIG. 6. For example, in FIG. 7, the extending direction of the second segment 122 is the extending direction of the dotted line in FIG. 7. For example, as shown in FIG. 8 and FIG. 9, at at least one position O where the first overlapping part 111 and the second overlapping part 121 are overlapped, the first overlapping part 111 and the second overlapping part 121 are electrically connected by a through hole I1 in the spacing insulating layer I.

For example, a size of the first overlapping part 111 in any direction is greater than or equal to a line width of the first wiring 11 in a direction perpendicular to the extending direction of the first wiring 11, and less than or equal to twice the line width of the first wiring 11 in the direction perpendicular to the extending direction of the first wiring 11, a size of the second overlapping part 121 in any direction is greater than or equal to a line width of the second wiring 12 in a direction perpendicular to the extending direction of the second wiring 12, and less than or equal to twice the line width of the second wiring 12 in the direction perpendicular to the extending direction of the second wiring 12. Thus, the reliability of the electrical connection between the first overlapping part 111 and the second overlapping part 121 is ensured.

For example, as shown in FIG. 6, the first wiring 11 is in the bent extension substantially along the first direction (the vertical direction in the figure) as a whole, and as shown in FIG. 7, the second wiring 12 is in the bent extension substantially along the second direction (the lower right direction in the figure) as a whole. For example, the angle between the first direction and the second direction ranges from 30° to 90°, such as 45°, 60°, or 70°. Therefore, when the touch structure is arranged on the display panel, the above design of the plurality of first wirings 11 and the plurality of second wirings 12 can make the extension positions of the plurality of first wirings 11 and the plurality of second wirings 12 avoid the light-emitting regions of the plurality of sub-pixels in the display panel, so as to avoid affecting the display effect of the plurality of sub-pixels.

It should be noted that, in the embodiments of the present disclosure, the extending direction of the first wiring or the second wiring as a whole refers to the macro extending direction of the first wiring or the second wiring as a whole when observing the first conductive layer and the second conductive layer as a whole.

For example, in some embodiments, in one touch unit, the plurality of first wirings 11 include at least one (for example, a plurality of) first connection wirings 11A, and the first overlapping part 111 of the first connection wiring 11A is electrically connected to the second overlapping part 121 of at least part of the plurality of second wirings 12 overlapped with the first overlapping part by a through hole in the spacing insulating layer I.

For example, the plurality of first overlapping parts 111 of the plurality of first connection wirings 11A are electrically connected with the second overlapping parts 121 of two adjacent second wiring 12 by through holes in the spacing insulating layer I to electrically connect the two adjacent second wirings 12, as shown in FIG. 8.

For example, second overlapping parts 121 of any two adjacent second wirings 12 are electrically connected by using one of the at least one first connection wiring 11A. For example, second overlapping parts 121 of part of the two adjacent second wirings 12 are electrically connected through the same first connection wiring 11A respectively, or the second overlapping parts 121 of part of the two adjacent second wirings 12 are electrically connected through different first connection wirings 11A respectively. Therefore, in each touch unit, all second wirings 12 may be electrically connected together through a plurality of first connection wirings 11A to form a touch sensing wiring of the touch unit for sensing touch operation. That is, in the embodiments of the present disclosure, the plurality of first connection wirings 11A included in the plurality of first wirings 11 are used to electrically connect the plurality of second wirings 12. Therefore, the plurality of first connection wirings 11A and the plurality of second wirings 12 constitute a touch sensing wiring of the touch unit for sensing touch operation.

For example, as shown in FIG. 6, the plurality of first connection wirings 11A are spaced apart from each other, for example, the plurality of first connection wirings 11A are spaced apart from each other in the plurality of first wirings 11. For example, in some examples, the plurality of first wirings 11 further include a plurality of second connection wirings 11B, and the plurality of second connection wirings 11B and the first connection wirings 11A are alternately disposed, for example, the plurality of second connection wirings 11B are respectively disposed between adjacent first connection wirings 11A, and the plurality of second connection wirings 11B may be used as touch wirings of the plurality of touch units. For example, the touch unit shown in FIGS. 6-8 may be the touch unit T13 in FIG. 5. In this case, the plurality of second connection wirings 11B may be used as touch wirings L11 and L12 of the plurality of touch units T11 and T12. For example, the plurality of second connection wirings 11B are insulated from the plurality of first connection wirings 11A and the plurality of second wirings 12, that is, in the first conductive layer, the plurality of second connection wirings 11B are spaced apart from the plurality of first connection wirings 11A.

For example, in some embodiments, as shown in FIG. 5, the touch structure may further include a touch driving circuit D, and the first connection wiring 11A is electrically connected to the touch driving circuit D. For example, in some examples, the plurality of second connection wirings 11B and the plurality of first connection wirings 11A are all electrically connected to the touch driving circuit D, so that the plurality of second connection wirings 11B and the plurality of first connection wirings 11A can receive electrical signals from the touch driving circuit D or transmit electrical signals to the touch driving circuit D. For example, the touch driving circuit D may be any form of control circuit such as a touch chip.

For example, in some embodiments, as shown in FIG. 6, the first conductive layer M1 may further have a third segment 113 connected to the plurality of first connection wirings 11A and extending in a different direction from the plurality of first connection wirings 11A, for example, the extending direction of the third segment 113 is perpendicular to the first direction. In this case, the third segment 113 may be used as a portion of the first connection wiring 11A, and the third segment 113 together with the plurality of second wirings 12 are used as a touch sensing line for sensing touch operations. Therefore, the arrangement of the third segment 113 expands the extension range of the touch sensing line, thereby improving the touch accuracy and the touch sensitivity of the touch structure.

For example, in some embodiments, as shown in FIG. 6, the first end of the third segment 113 is connected to the plurality of first connection wirings 11A, and the second end of the third segment 113 is spaced apart from the plurality of adjacent second connection wirings 11, and the minimum distance G1 of the interval ranges from 1 μm to 6 μm, such as 1 μm, 2 μm, 3 μm, 4 μm, 4.5 μm, 5 μm or 5.5 μm, etc., so that the third segment 113 with a longer extension length can be realized, and at the same time, the first connection wiring 11A and the second connection wiring 11B can have a sufficient safety distance to maintain insulation.

For example, in some embodiments, as shown in FIG. 6, the first conductive layer M1 may further have a fourth segment 114 spaced apart from the plurality of first wirings 11 and extending in a different direction from the plurality of first wirings 11. For example, the extending direction of the fourth segment 114 is the same as the extending direction of the third segment 113. For example, both ends of the fourth segment 114 are spaced apart from the plurality of first wirings 11, and the minimum distances G2 and G3 between the both ends of the fourth segment 114 and the plurality of first wirings 11 range from 1 μm to 6 μm, for example, both are 1 μm, 2 μm, 3 μm, 4 μm, 4.5 μm, 5 μm, or 5.5 μm. μm, etc. In the embodiments of the present disclosure, the fourth segment 114 is used as a dummy line and is not connected to any circuit structure. The arrangement of the fourth segment 114 can make the pattern of the first conductive layer M1 uniform, and during the preparation process of the touch structure, the arrangement of the fourth segment 114 can keep the etching uniformity of the pattern of the first conductive layer M1 to enable the first conductive layer M1 to have a higher preparation precision, and make the prepared first conductive layer M1 have a more uniform visual effect on the entire surface.

For example, in some embodiments, as shown in FIG. 7, the plurality of second wirings 12 may further have a fifth segment 123 connected to the second segment 122 of the plurality of second wirings 12 and extending in a different direction from the second segment 122. For example, the extending direction of the fifth segment 123 intersects the second direction, for example, perpendicular to the second direction. For example, in a direction perpendicular to the surface of the substrate B, the fifth segment 123 does not overlap with the plurality of first wirings 11. In the embodiments of the present disclosure, the fifth segment 123 can expand the extension range of the plurality of second wirings 12 as the touch sensing line, thereby improving the touch accuracy and touch sensitivity of the touch structure.

For example, in some embodiments, line widths (that is, a size in a direction perpendicular to the extending direction of the wiring) of the plurality of first wirings 11 may range from 2 μm to 4 μm, such as 2.5 μm, 3 μm or 3.5 μm. Line widths of the plurality of second wirings 12 may range from 2 μm to 4 μm, for example, 2.5 μm, 3 μm, or 3.5 μm. The line widths of the plurality of first wirings 11 and the line widths of the plurality of second wirings 12 may be the same or different.

For example, in the embodiments of the present disclosure, the first conductive layer M1 and the second conductive layer M2 of the touch structure may be metal layers or transparent conductive layers, and the materials may include metal materials such as copper and aluminum, or transparent metal oxide materials such as ITO and IZO. The substrate B may include inorganic insulating materials such as silicon oxide, silicon nitride or silicon oxynitride, or organic insulating materials such as polyimide. The spacing insulating layer I may also include inorganic insulating materials such as silicon oxide, silicon nitride or silicon oxynitride, or organic insulating materials such as polyimide. For example, as shown in FIG. 9, the second conductive layer M2 of the touch structure may also be covered with a protective insulating layer P, and the protective insulating layer P may also include inorganic insulating materials such as silicon oxide, silicon nitride, or silicon oxynitride, or organic insulating materials such as polyimide to protect the second conductive layer M2. The embodiments of the present disclosure do not specifically limit other structures and materials of the touch structure.

Figure 10:
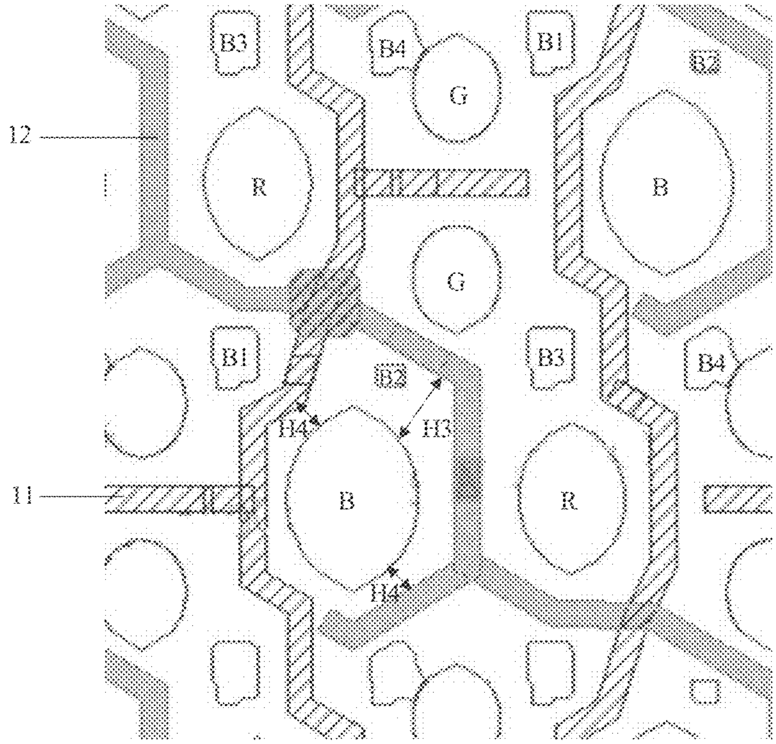
FIG. 10 is a partial planar diagram of a display panel provided by at least one embodiment of the present disclosure.
Figure 11:
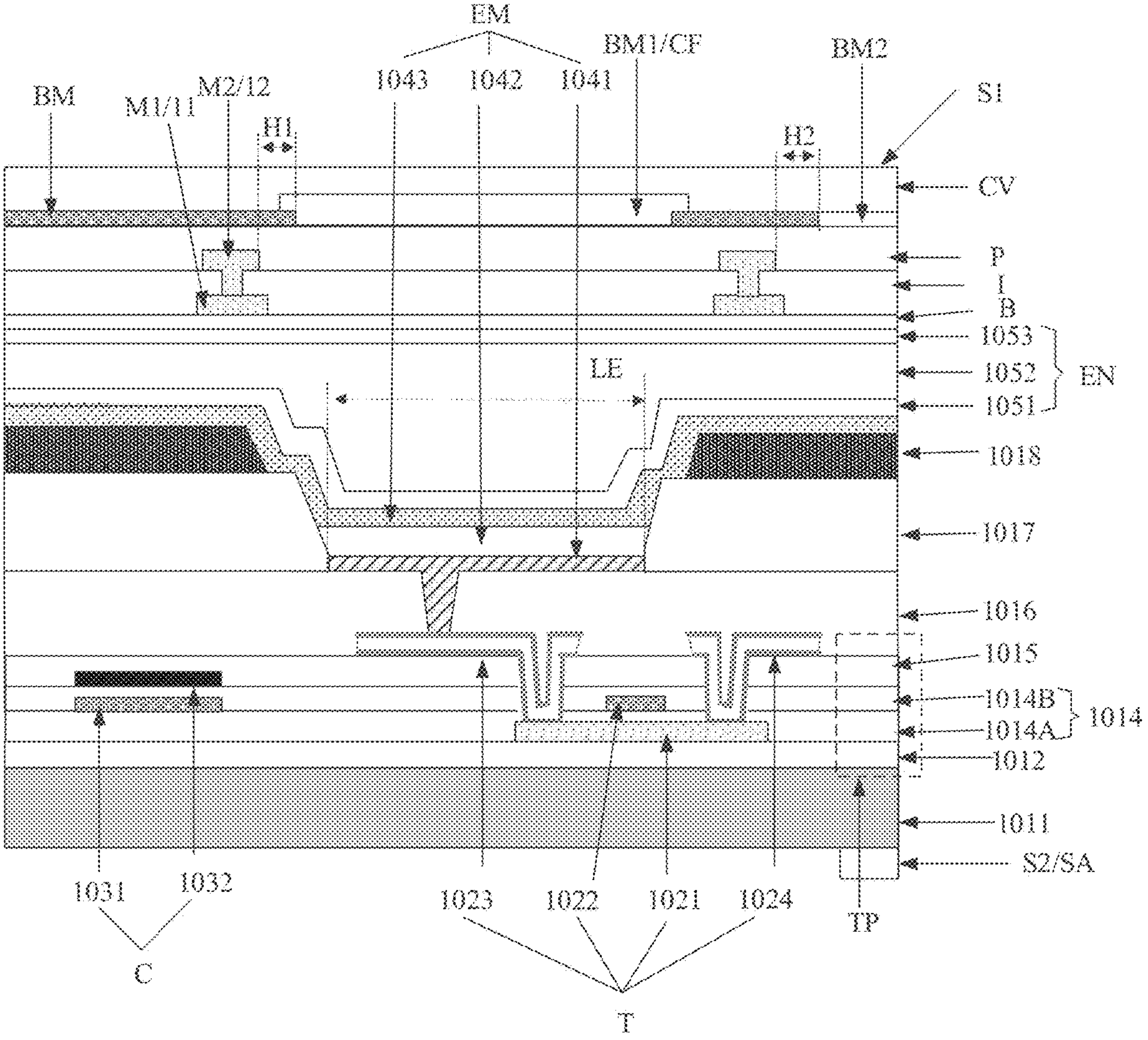
FIG. 11 is a schematic cross-sectional diagram of a sub-pixel of a display panel provided by at least one embodiment of the present disclosure.

At least one embodiment of the present disclosure provides a display panel, the display panel includes a display substrate and the touch structure provided by the embodiments of the present disclosure, for example, FIG. 10 is a partial planar diagram of the display panel, and the touch structure shown in FIG. 10 is, for example, the portion of the touch structure shown in FIG. 5 in the dotted frame, and FIG. 11 is a schematic partial cross-sectional diagram of one sub-pixel of the display panel.

As shown in FIG. 11, the display substrate includes a base substrate 1011 and a driving circuit layer, a light-emitting member layer and an encapsulation layer EN sequentially arranged on the base substrate 1011; the touch structure is arranged on a side of the encapsulation layer EN away from the base substrate 1011, in this case, the first conductive layer M1 is closer to the encapsulation layer EN than the second conductive layer M2.

For example, the display substrate has a plurality of pixel units arranged in an array for performing display operations. Each of the plurality of pixel units includes a plurality of sub-pixels, and each of the plurality of sub-pixels includes a pixel driving circuit disposed in the driving circuit layer and a light-emitting member EM disposed in the light-emitting member layer, and the light-emitting member EM has a light-emitting region LE.

For example, as shown in FIG. 11, the pixel driving circuit includes a thin film transistor T, a storage capacitor C and the like. The thin film transistor T includes an active layer 1021, a gate electrode 1022, a gate insulating layer 1014 (for example, including a first gate insulating layer 1014A and a second gate insulating layer 1014B), an interlayer insulating layer 1015 and source and drain electrodes (including a source electrode 1023 and a drain electrode 1024). The storage capacitor C includes a first electrode plate 1031 and a second electrode plate 1032. For example, the first electrode plate 1031 and the gate electrode 1022 are in the same layer, and the second electrode plate 1032 is between the gate insulating layer 1014 and the interlayer insulating layer 1015.

It should be noted that, in the embodiments of the present disclosure, the arrangement of two structural layers or functional layers in a/the same layer means that the two structural layers or functional layers may be formed by the same preparation process (such as a patterning process, etc.) using the same material layer. Therefore, the preparation process of the display substrate can be simplified.

For example, the pixel driving circuit may be formed into a 2T1C structure (two thin film transistors and one storage capacitor), 6T1C structure (six thin film transistors and one storage capacitor), etc., and therefore include a plurality of thin film transistors, and the plurality of thin film transistors have structures similar to or the same as the stacked structures shown in FIG. 11, only the thin film transistor directly connected to the light-emitting member is shown in FIG. 11, the thin film transistor may be a driving thin film transistor, a light emission control thin film transistor, or the like.

For example, as shown in FIG. 11, the display substrate may further include a planarization layer 1016, a pixel definition layer 1017 and a spacer 1018. The planarization layer 1016 is used to planarize the pixel driving circuit. The pixel definition layer 1017 is disposed on a side of the planarization layer 1016 away from the pixel driving circuit. The pixel definition layer 1017 includes a plurality of sub-pixel openings for defining the light-emitting regions LE of the plurality of sub-pixels.

For example, the light-emitting member EM includes an anode layer 1041, a light-emitting layer 1042 and a cathode layer 1043. The anode layer 1041 is connected to the source electrode 1023 of the thin film transistor T by a through hole in the planarization layer 1016. For example, the cathode layer 1043 is formed over the entire surface of the base substrate 1011. For example, in some examples, auxiliary light-emitting layers (not shown in the figure) that help the light-emitting layer 1042 to emit light may be provided between the anode layer 1041 and the light-emitting layer 1042 and between the cathode layer 1043 and the light-emitting layer 1042, the auxiliary light-emitting layers may further include, for example, one or more of an electron transport layer, an electron injection layer, a hole transport layer, and a hole injection layer, which are not shown in the figure.

For example, in some embodiments, as shown in FIG. 11, the display substrate may further include a buffer layer 1012 disposed on the base substrate 1011. The buffer layer 1012 can provide a flat surface and prevent impurities such as water and oxygen from penetrating the base substrate 1011 into functional structures such as pixel driving circuits, so as to protect the other functional structures on the base substrate 1011.

For example, in some embodiments, as shown in FIG. 11, the display panel may further include a black matrix layer BM, and the black matrix layer BM is disposed on a side of the touch structure away from the base substrate 1011 (the case shown in the figure) or on a side of the touch structure close to the base substrate 1011. The black matrix layer BM includes a plurality of first light-transmitting openings BM1 and a plurality of second light-transmitting openings BM2. The plurality of first light-transmitting openings BM1 are configured to respectively transmit light emitted by the plurality of light-emitting members EM. For example, orthographic projections of the plurality of first light-transmitting openings BM1 on the base substrate 1011 at least partially overlap with, for example, completely overlap with, orthographic projections of the light-emitting regions LE of the plurality of light-emitting members EM on the base substrate 1011, respectively.

For example, in some examples, each pixel unit includes one red sub-pixel, one blue sub-pixel, and two green sub-pixels. In this case, as shown in FIG. 10, the plurality of first light-transmitting openings BM1 include a first light-transmitting opening R corresponding to the light-emitting member of the red sub-pixel, a first light-transmitting openings B corresponding to the light-emitting member of the blue sub-pixel and a first light-transmitting opening G corresponding to the light-emitting member of the green sub-pixel.

For example, in some embodiments, as shown in FIG. 11, the driving circuit layer includes a plurality of light-transmitting portions TP, and each of at least part of the second light-transmitting openings BM2 is disposed corresponding to at least one of the plurality of light-transmitting portions TP, and in the corresponding second light-transmitting opening BM2 and the light-transmitting portion TP, the orthographic projection of the second light-transmitting opening BM2 on the base substrate 1011 at least partially overlaps with the orthographic projection of the light-transmitting portion TP on the base substrate 1011. The second light-transmitting opening BM2 and the light-transmitting portion TP may be used to transmit sensing light, such as sensing light for the texture recognition, etc., which will be described in detail later.

For example, in a direction parallel to the surface of the base substrate 1011, at least part of the light-transmitting portions TP are respectively disposed between the light-emitting regions LE of the light-emitting members EM of adjacent sub-pixels. For example, the plurality of light-transmitting portions TP are respectively disposed between pixel driving circuits of adjacent sub-pixels.

For example, in some embodiments, the plurality of pixel units include at least one first pixel unit, and the plurality of sub-pixels included in the first pixel unit and the plurality of second light-transmitting openings are in one-to-one correspondence and are overlapped with each other in a direction perpendicular to the display substrate. For example, the plurality of pixel units are all first pixel units. In this case, each sub-pixel in the display panel corresponds to one second light-transmitting opening BM2.

For example, in some examples, as shown in FIG. 10, the plurality of second light-transmitting openings BM2 include a second light-transmitting opening B1, a second light-transmitting opening B2, a second light-transmitting openings B3, and a second light-transmitting opening B4 respectively corresponding to different sub-pixels of the first pixel unit. For example, shapes and sizes of the second light-transmitting opening B1, the second light-transmitting opening B2, the second light-transmitting opening B3, and the second light-transmitting opening B4 are all different.

For example, in some embodiments, in a direction perpendicular to the base substrate 1011 (vertical direction in the figure), the plurality of first wirings 11 and the plurality of second wirings 12 do not overlap with the plurality of first light-transmitting openings BM1 and the plurality of second light-transmitting openings BM2.

For example, in some embodiments, as shown in FIG. 11, in the direction parallel to the base substrate 1011 (horizontal direction in the figure), a distance H1 between the plurality of first light-transmitting openings BM1 and the plurality of first wirings 11 and/or the plurality of second wirings 12 is greater than 1 μm, for example, greater than 2.5 μm, for example, H1 is 3 μm or 3.5 μm, or the like. For example, in some embodiments, in the direction parallel to the base substrate 1011, a distance H2 between the plurality of second light-transmitting openings BM2 and the plurality of first wirings 11 and/or the plurality of second wirings 12 is also greater than 1 μm, for example, greater than 2.5 μm, for example, H2 is 3 μm or 3.5 μm, etc. Therefore, the distances from the plurality of first light-transmitting openings BM1 and the plurality of second light-transmitting openings BM2 to the plurality of first wirings 11 and the plurality of second wirings 12 are far enough, and the plurality of first wirings 11 and the plurality of second wirings 12 are sufficiently blocked by the black matrix layer BM, so that even under strong light, users will not see the plurality of first wirings 11 and the plurality of second wirings 12 from the surface of the display panel, which improves the user visual experience.

For example, in some embodiments, as shown in FIG. 10, one first wiring 11 or one second wiring 12 is disposed between two adjacent second light-transmitting openings BM2 of the plurality of second light-transmitting openings BM2. For example, in the example shown in FIG. 10, one first wiring 11 is provided between the second light-transmitting opening B1 and the second light-transmitting opening B2, and one second wiring 12 is provided between the second light-transmitting opening B2 and the second light-transmitting opening B3, and one first wiring 11 is provided between the second light-transmitting opening B3 and the second light-transmitting opening B4. Therefore, the plurality of second light-transmitting openings BM2 are evenly provided between the plurality of first wirings 11 and the plurality of second wirings 12, which contributes to the uniformity of the display panel.

For example, in the direction perpendicular to the base substrate 1011, the plurality of first wirings 11 and the plurality of second wirings 12 do not overlap with the light-emitting regions LE of the light-emitting members EM of the plurality of sub-pixels, thereby avoiding affecting the display effect of the plurality of sub-pixels.

For example, in some embodiments, as shown in FIG. 10, in the direction parallel to the surface of the base substrate 1011, at least one second light-transmitting opening BM2 in the plurality of second light-transmitting openings BM2 is located between the light-emitting region LE of the light-emitting member of one sub-pixel and one first wiring 11 or one second wiring 12, and a distance between the light-emitting region LE of the light-emitting member of the one sub-pixel and the first wiring 11 or the second wiring 12 adjacent to the at least one second light-transmitting opening BM2 is greater than a distance between the light-emitting region LE of the light-emitting member of the one sub-pixel and the other first wirings 11 or second wirings 12.

For example, in some examples, as shown in FIG. 10, in the direction parallel to the surface of the base substrate 1011, the second light-transmitting opening B2 is located between the light-emitting region LE of the light-emitting member of the blue sub-pixel and one second wiring 12, the distance H3 between the light-emitting region LE of the light-emitting member of the blue sub-pixel and the second wiring 12 adjacent to the second light-transmitting opening B2 is greater than the distance H4 between the light-emitting region of the light-emitting member of the blue sub-pixel and the other first wirings 11 or second wirings 12. Therefore, the first light-transmitting openings BM1, the second light-transmitting openings BM2, the plurality of first wirings 11 and the plurality of second wirings 12 are evenly arranged in the display panel, so as to avoid the interaction between the display function and the touch function in the display panel, and improve the display effect and touch effect of the display panel.

For example, in some embodiments, as shown in FIG. 11, the display panel may further include a plurality of color filters CF respectively arranged in the plurality of first light-transmitting openings BM1. The plurality of color filters CF include a plurality of filters of different colors to respectively correspond to the light-emitting members of sub-pixels of different colors. For example, colors of the correspondingly arranged sub-pixel and color filter CF are the same, so that after the light emitted from the light-emitting member of the sub-pixel passes through the color filter CF, the color of the emitted light is more pure, and the display effect of the display panel is better.

For example, in some embodiments, as shown in FIG. 11, the display panel may further include a texture touch surface S1 and an image sensor array SA, the image sensor array SA is arranged on a side of the driving circuit layer away from the light-emitting member layer, the image sensor array SA includes a plurality of image sensors S2, the plurality of image sensors S2 are configured to receive light emitted from the plurality of light-emitting members EM in the light-emitting member layer and reflected by the texture (such as fingerprint or palmprint, etc.) on the texture touch surface S1 to the plurality of image sensors S2 through the second light-transmitting opening BM2 and the light-transmitting part TP for the texture collection. Therefore, the display panel also has a texture recognition function.

For example, in some embodiments, the image sensor SA may be arranged on a side of the base substrate 1011 away from the driving circuit layer, so that in the preparation process, the image sensor SA may be attached to the base substrate 1011 after the preparation of the display substrate is finished, so as not to affect the preparation process of the display substrate.

For example, in some embodiments, as shown in FIG. 11, the display panel may further include a transparent cover plate CV arranged on a side of the black matrix layer BM away from the base substrate 1011. For example, the surface of the transparent cover plate CV is formed as the texture touch surface S1. For example, the transparent cover CV may be a glass cover.

For example, in some embodiments, the display substrate may be a flexible display substrate. In this case, the base substrate 1011 may include a flexible insulating material such as polyimide (PI). For example, in some examples, the base substrate 1011 may be a stacked structure in which a plurality of flexible layers and a plurality of barrier layers are alternately arranged, such as a stacked structure in which two flexible layers and two barrier layers are alternately arranged. In this case, the flexible layer may include polyimide, and the barrier layer may include inorganic insulating materials such as silicon oxide, silicon nitride or silicon oxynitride. For example, in some embodiments, the display substrate may also be a rigid substrate. In this case, the base substrate 1011 may be a rigid substrate such as glass and quartz.

For example, in the embodiments of the present disclosure, the buffer layer 1012 may adopt inorganic insulating materials such as silicon oxide, silicon nitride or silicon oxynitride, the active layer 1021 may adopt materials such as polysilicon and metal oxide, the gate insulating layer 1014 may adopt inorganic insulating materials such as silicon oxide, silicon nitride or silicon oxynitride, and the gate electrode 1022 and the first electrode plate 1031 may adopt metal materials such as copper, aluminum, titanium or cobalt, for example, may be formed into a single-layer structure or a multi-layer structure, such as a multi-layer structure of titanium/aluminum/titanium or molybdenum/aluminum/molybdenum, the second electrode plate 1032 may adopt metal materials such as copper, aluminum, titanium, cobalt, or alloy materials thereof, the interlayer insulating layer 1015 may adopt inorganic insulating materials such as silicon oxide, silicon nitride or silicon oxynitride, and the source and drain electrodes 1023 and 1024 may adopt metal materials such as copper, aluminum, titanium or cobalt, for example, may be formed into a single-layer structure or a multi-layer structure, such as a multi-layer structure of titanium/aluminum/titanium and molybdenum/aluminum/molybdenum, and the material of the anode layer 1041 may include metal oxides such as ITO and IZO or metal materials such as Ag, Al and Mo or alloy materials thereof. The material of the light-emitting layer 1042 and the material of the auxiliary light-emitting layer are organic materials. The material of the light-emitting layer 1042 may select a light-emitting material that can emit a certain color light (such as red light, blue light, green light, etc.) according to needs. The material of the cathode layer 1043 may include metal materials such as Mg, Ca, Li or Al or alloy materials thereof, or include metal oxides such as IZO and ZTO, or organic materials with conductive properties such as PEDOT/PSS (poly 3,4-ethylene dioxythiophene/polystyrene sulfonate). The planarization layer 1016, the pixel definition layer 1017 and the spacer 1018 may adopt organic insulating materials such as polyimide.

For example, the encapsulation layer EN is a composite encapsulation layer, which includes a first inorganic encapsulation layer 1051, a first organic encapsulation layer 1052 and a second inorganic encapsulation layer 1053 sequentially stacked. For example, the first inorganic encapsulation layer 1051 and the second inorganic encapsulation layer 1053 may adopt inorganic materials such as silicon nitride, silicon oxide or silicon oxynitride, and the first organic encapsulation layer 1052 may adopt organic materials such as polyimide (PI) or epoxy resin. The composite encapsulation layer may form multiple protection for the functional structure on the display panel, and has better encapsulation effect. The embodiments of the present disclosure do not specifically limit the materials of various functional structures on the display panel.

The following statements should be noted:

(1) The accompanying drawings involve only the structure(s) in connection with the embodiment(s) of the present disclosure, and other structure(s) may be referred to common design(s).

(2) For the purpose of clarity, in accompanying drawings for illustrating the embodiment(s) of the present disclosure, the thickness of a layer or a region may be enlarged or reduced, that is, the accompanying drawings are not drawn according to the actual scale. However, it should understood that, in the case in which a component such as a layer, film, region, substrate or the like is referred to be "on" or "under" another component, it may be directly on or under the another component or a component is interposed therebetween.

(3) In case of no conflict, features in one embodiment or in different embodiments may be combined to obtain a new embodiment.

What are described above is related to the specific embodiments of the disclosure only and not limitative to the protection scope of the disclosure. The protection scope of the disclosure shall be based on the protection scope of the claims.

What is claimed is:

1. A touch structure, comprising a substrate and a plurality of touch units on the substrate, wherein at least one of the plurality of touch units comprises a first conductive layer, a spacing insulating layer and a second conductive layer sequentially stacked on the substrate;

the first conductive layer comprises a first pattern formed by a plurality of first wirings spaced apart from each other, and the second conductive layer comprises a second pattern formed by a plurality of second wirings spaced apart from each other, at least one of the plurality of first wirings comprises a first overlapping part overlapped with at least one of the plurality of second wirings, the at least one of the plurality of second wirings comprises a second overlapping part overlapped with the first overlapping part, and a first segment in which the first overlapping part is located has a different extending direction from a second segment in which the second overlapping part is located, the first segment is a segment of the first wiring with the first overlapping part as an extending end, and the second segment is a segment of the second wirings with the second overlapping part as an extending end, wherein in at least one position at which the first overlapping part is overlapped with the second overlapping part, the first overlapping part and the second overlapping part are electrically connected by a through hole in the spacing insulating layer, wherein the first wiring substantially extends along a first direction wholly, and the second wiring substantially extends along a second direction wholly, wherein an angle between the first direction and the second direction is greater than or equal to 30 degrees and less than 90 degrees.

2. The touch structure according to claim 1, wherein the first segment comprises a straight line segment and the second segment comprises a straight line segment, and extending directions of the first segment and the second segment are respectively extending directions of the straight line segments, and/or the first segment comprises an arc segment and the second segment comprises an arc segment, and extending directions of the first segment and the second segment are respectively extending directions of tangents of the arc segments by taking the first overlapping part and the second overlapping part as ends.

3. The touch structure according to claim 1, wherein a size of one first overlapping part in any direction is greater than or equal to a line width of the first wiring in a direction perpendicular to an extending direction of the first wiring, and less than or equal to twice the line width of the first wiring in the direction perpendicular to the extending direction of the first wiring;

a size of one second overlapping part in any direction is greater than or equal to a line width of the second wiring in a direction perpendicular to an extending direction of the second wiring, and less than or equal to twice the line width of the second wiring in the direction perpendicular to the extending direction of the second wiring.

4. The touch structure according to claim 1, wherein at at least one position at which the first overlapping part is overlapped with the second overlapping part, the first overlapping part and the second overlapping part are electrically connected by a through hole in the spacing insulating layer.

5. He touch structure according to claim 1, wherein in one touch unit, the plurality of first wirings comprise a plurality of first connection wirings, and a first overlapping part of each of the plurality of first connection wirings is electrically connected with a second overlapping part of at least part of the plurality of second wirings overlapped with the first overlapping part by a through hole in the spacing insulating layer.

6. The touch structure according to claim 5, wherein second overlapping parts of any two adjacent second wirings are electrically connected through at least one of the plurality of first connection wirings first connection wiring.

7. The touch structure according to claim 5, wherein the plurality of first connection wirings are spaced apart from each other;

the plurality of first connection wirings further comprise a plurality of second connection wirings, and the plurality of second connection wirings are spaced apart from the first connection wirings;

the plurality of second connection wirings are insulated from the plurality of first connection wirings and the plurality of second wirings.

8. The touch structure according to claim 7, further comprising a touch driving circuit, wherein the first connection wiring is electrically connected with the touch driving circuit.

9. The touch structure according to claim 7, wherein the first conductive layer further has a third segment connected to the plurality of first connection wirings and extending in a different direction from the plurality of first connection wirings, wherein a first end of the third segment is connected to the plurality of first connection wirings, and a second end of the third segment is spaced apart from adjacent second connection wirings, and a minimum distance of an interval between the second end and the adjacent second connection wirings ranges from 1 μm to 6 μm.

10. The touch structure according to claim 7, wherein the first conductive layer further has a fourth segment spaced apart from the plurality of first wirings and extending in a different direction of the plurality of first wirings, wherein both ends of the fourth segment are spaced apart from the plurality of first wirings, and a minimum distance of an interval between each of the both ends and the plurality of first wirings ranges from 1 μm to 6 μm.

11. The touch structure according to claim 1, wherein line widths of the plurality of first wirings range from 2 μm to 4 μm; and/or line widths of the plurality of second wirings range from 2 μm to 4 μm.

12. A display panel, comprising:

a display substrate, comprising a base substrate and a driving circuit layer, a light-emitting member layer and an encapsulation layer sequentially arranged on the base substrate; and the touch structure according to claim 1, on a side of the encapsulation layer away from the base substrate, wherein the first conductive layer is closer to the encapsulation layer than the second conductive layer.

13. The display panel according to claim 12, further comprising:

a black matrix layer, on a side of the touch structure away from the base substrate or on a side of the touch structure close to the base substrate, and comprising a plurality of first light-transmitting openings and a plurality of second light-transmitting openings, wherein the light-emitting member layer comprises a plurality of light-emitting members, and the plurality of first light-transmitting openings are configured to respectively transmit light emitted by the plurality of light-emitting members, the driving circuit layer comprises a plurality of light-transmitting parts, each of at least part of the second light-transmitting openings is disposed correspondingly to at least one of the plurality of light-transmitting parts, and in a second light-transmitting opening and a light-transmitting part disposed correspondingly, an orthographic projection of the second light-transmitting opening on the base substrate at least partially overlaps with an orthographic projection of the light-transmitting part on the base substrate, wherein in a direction parallel to the base substrate, distances between the plurality of second light-transmitting openings and the plurality of first wirings and/or the plurality of second wirings are greater than 1 μm, wherein in the direction parallel to the base substrate, distances between the plurality of first light-transmitting openings and the plurality of first wirings and/or the plurality of second wirings are greater than 1 μm.

14. The display panel according to claim 13, wherein in a direction perpendicular to the base substrate, the plurality of first wirings and the plurality of second wirings do not overlap with the plurality of first light-transmitting openings and the plurality of second light-transmitting openings.

15. The display panel according to claim 14, wherein one first wiring or one second wiring is disposed between two adjacent second light-transmitting openings of the plurality of second light-transmitting openings.

16. The display panel according to claim 14, wherein the display substrate has a plurality of pixel units arranged in an array, each of the plurality of pixel units comprises a plurality of sub-pixels, and each of the plurality of sub-pixels comprises a pixel driving circuit in the driving circuit layer and a light-emitting member in the light-emitting member layer, the light-emitting member has a light-emitting region;

at least portion of the plurality of light-transmitting parts are disposed between light-emitting regions of light-emitting members of adjacent sub-pixels.

17. The display panel according to claim 16, wherein in the direction perpendicular to the base substrate, the plurality of first wirings and the plurality of second wirings do not overlap with light-emitting regions of light-emitting members of the plurality of sub-pixels.

18. The display panel according to claim 17, wherein in a direction parallel to the base substrate, at least one second light-transmitting opening of the plurality of second light-transmitting openings is provided between a light-emitting region of a light-emitting member of one sub-pixel and a first wiring or a second wiring, a distance from the light-emitting region of the light-emitting member of the one sub-pixel to the first wiring or the second wiring adjacent to the at least one second light-transmitting opening is greater than a distance between the light-emitting region of the light-emitting member of the one sub-pixel and other first wirings or second wirings.

19. The display panel according to claim 16, wherein the plurality of pixel units comprise at least one first pixel unit, in a direction perpendicular to the display substrate, a plurality of sub-pixels included in the first pixel unit and the plurality of second light-transmitting openings are in one-to-one correspondence and overlap with each other.

20. The display panel according to claim 13, further comprising a texture touch surface and an image sensor array, wherein the image sensor array is on a side of the driving circuit layer away from the light-emitting member layer, and comprises a plurality of image sensors, and the plurality of image sensors are configured to receive light emitted from the plurality of light-emitting member in the light-emitting member layer and reflected by a texture on the texture touch surface and reaching the plurality of image sensors through the second light-transmitting opening and the light-transmitting part for a texture collection.

* * * * *